(12) United States Patent
Miki et al.

(10) Patent No.: US 8,483,341 B2
(45) Date of Patent: Jul. 9, 2013

(54) SIGNAL GENERATION SYSTEM

(75) Inventors: Yasuhiko Miki, Tokyo (JP); Hideaki Okuda, Yokohama (JP)

(73) Assignee: Tektronix International Sales GmbH (CH)

( * ) Notice: Subject to any disclaimer, the term of this patent is extended or adjusted under 35 U.S.C. 154(b) by 972 days.

(21) Appl. No.: 12/340,639

(22) Filed: Dec. 19, 2008

(65) Prior Publication Data

US 2009/0167375 A1 Jul. 2, 2009

(30) Foreign Application Priority Data

Dec. 27, 2007 (JP) ................................ 2007-337324

(51) Int. Cl.
*H04L 7/00* (2006.01)
(52) U.S. Cl.
USPC ........... 375/355; 375/354; 375/360; 375/362; 375/364; 375/370; 327/117; 327/163
(58) Field of Classification Search
USPC ................. 375/360, 362, 370, 371, 354–355, 375/364; 327/117, 163
See application file for complete search history.

(56) References Cited

U.S. PATENT DOCUMENTS

| | | | | |
|---|---|---|---|---|
| 5,521,949 A | * | 5/1996 | Huang et al. | 375/377 |
| 6,807,509 B2 | * | 10/2004 | Bourdin et al. | 702/125 |
| 7,289,587 B2 | * | 10/2007 | Rentschler et al. | 375/362 |
| 7,436,725 B2 | | 10/2008 | Miki | |
| 7,477,712 B2 | * | 1/2009 | Fischer et al. | 375/359 |
| 7,890,684 B2 | * | 2/2011 | Berenbaum et al. | 710/110 |
| 2005/0238127 A1 | * | 10/2005 | Naffziger et al. | 375/364 |
| 2006/0222125 A1 | * | 10/2006 | Edwards et al. | 375/354 |

OTHER PUBLICATIONS

"Agilent PSG Signal Generators", Aug. 25, 2008.

* cited by examiner

*Primary Examiner* — Sophia Vlahos
(74) *Attorney, Agent, or Firm* — William K. Bucher; Marger Johnson & McCollom, P.C.

(57) ABSTRACT

A signal generation system maintains a phase relationship between output signals of first and second signal generators even when the sampling clock frequency is changed. The signal generators are coupled via a communication means including a dedicated cable where the delay amount of the communication means is known and fixed. The first signal generator provides sampling clock, sequence clock and trigger/event signals to the second signal generator and CPUs of the generators share information via the cable. When the frequency of the sampling clock is changed, the CPU of the first or second signal generator calculates the clock number of the frequency changed sampling clock equivalent to the delay amount of the communication means. A delay circuit of the first signal generator 100 delays the waveform data by one sampling clock based on the calculated value for adjusting phase relationship between the waveform data in the signal generators 1.

8 Claims, 7 Drawing Sheets

| Index | CH1 Waveform | CH2 Waveform | Wait | Loop | Event Jump To | Go To |
|---|---|---|---|---|---|---|
| 1 | Sine-13 | Square-5 | | | | |
| 2 | Ramp | Square-6 | | | | |
| 3 | Sine-10 | Ramp | On | | | |
| 4 | Square-5 | DVD Write | | | | |
| 5 | Square-6 | Sine-10 | | 100 | 15 | |
| 6 | Ramp | Sine-11 | | | | 20 |

SIGNAL GENERATION SYSTEM

BACKGROUND OF THE INVENTION

The present invention relates generally to signal generators and more particularly to a signal generation system having a plurality of signal generators coupled via a cable(s) that can automatically adjust phases between outputs of the signal generators when the frequency of the sampling clock is changed.

A signal generator produces an electronic signal corresponding to arbitrary waveform data that may be set by a user. The electronic signal may be applied to a circuit under test to confirm the proper operation of the circuit. The circuit under test generates an output signal in response to the input test signal which is measured with an oscilloscope. The AWG7000 series of Arbitrary Waveform Generators, manufactured by Tektronix, Inc., Beaverton, Oreg., USA, are examples of signal generators that generate electronic signals in response to arbitrary waveform data stored in the signal generator.

A signal generator typically has two or four output channels. If more channels are required a plurality of signal generators may be used at a time. It is important when using the outputs of multiple signal generators to align phases between the outputs of the generators. In a conventional method of aligning phases between the outputs of signal generators, one of the signal generators may be assigned as the master and provide a reference oscillation signal to an external distribution amplifier that amplifies the reference oscillation signal to provide to other signal generators (slaves) for operating in a phase locked and coherent mode at a common frequency as described in: "PSG Signal Generators Brochure", by Agilent Technologies, Inc., USA disclosing that the E8267D PSG Vector signal generators provide phase locked signals using the Z5623AK05 Distribution Amplifier, URL: http://cp.literature.agilent.com/litweb/pdf/5989-1324EN.pdf.

Signal generator may have a trigger function that initiates the start of the signal output according to a given signal provided from an external circuit, user operation through an operation panel, or the like. The signal generator may also have an event function that changes the type of the output signal according to a given signal provided from an external circuit, user operation through the operation panel, or the like. When the trigger and/or event functions start and/or change the output signal, it is necessary to keep the phase relationship between the outputs of the signal generators.

SUMMARY OF THE INVENTION

A signal generation system according to the present invention automatically adjusts phase relationship between the output data of signal generators even if the signal generators provide data and/or signals depending on a timing (trigger/event) signal. Each signal generator has a means for providing a frequency variable sampling clock, a means for dividing the sampling clock to provide a divided clock, a sequence control means for controlling data supply order, a waveform memory means for providing the data according to the divided clock, means for providing the sequence control means with a timing (trigger/event) signal that controls data supply timing, a delay means for delaying the data by one sampling clock, a means for parallel to serial converting the data from the delay means to provide fast data according to the sampling clock, and a central control means, such as a CPU, for controlling the respective means. The signal generators are coupled with a cable(s) dedicated for the signal generators. The sampling clock and timing signal of the first signal generator is provided to the second signal generator using a communication means including the cable and the peripheral circuits. The communication means is also used to communicate information between the central control means of the first and second signal generators. The delay amount of a signal through the communication means is known since it is specifically dedicated for the signal generators. However, the second signal generator works in accordance with the sampling clock provided from the first signal generator so that the clock number of the sampling clock equivalent to the delay amount is changed if the frequency of the sampling clock is changed in spite of delay amount of the communication means being fixed. Then the central control means of the first or second signal generator according to the present invention calculates the clock number of the sampling clock representative of the delay amount of the communication means when the sampling clock frequency of the first signal generator is changed, and the delay means of the first signal generator delays the waveform data to adjust the phase relationship between the fast data generated in the first and second signal generators.

For more accurate adjustment of the phase relationship between the waveform data of the signal generators, the phase adjustment may include the amount less than one sampling clock in addition to the clock number of the sampling clock. Then, the first and second signal generators may further have a first sampling clock phase adjustment means for adjusting the phase of the sampling clock provided to the dividing means and a second sampling clock phase adjustment means for adjusting the phase of the sampling clock provided to the parallel to serial conversion means. The central control means of the first or second signal generator calculates the clock number of the sampling clock and the clock phase after the sampling clock frequency of the first signal generator is changed and the delay means of the first signal generator delays the waveform data according to the clock number and the first and second sampling clock adjustment means of the first or second signal generator adjusts the sampling clock phase to adjust the phase relationship between the fast waveform data generated in the first and second signal generators.

For easier calculation of the phase relationship, the communication means may provide the divided clock of the first signal generator to the second signal generator when the first and second signal generators are coupled via the communication means to align the phases of the divided clocks of the first and second signal generators as an initial settings. After that, every frequency change of the sampling clock makes both the phases go off each time. However, the initial alignment makes the central control means of the first or second signal generator in charge of calculating the clock number for the phase adjustment easily realizes the phase relationship between the data of the first and second signal generators. For this phase comparison, the second signal generator may further have a means for comparing the phases of the divided clocks. After the divided clock phase comparison means aligns the phases of the divided clocks of the first and second signal generators, the central control means of the first or second signal generator calculates the clock number of the frequency changed sampling clock representative of the delay amount of the communication means.

The second signal generator detects the timing (trigger or event) signal from the first signal generator according to the divided clock so that if the phase of the divided clock of the second signal generator delays relative to the divided clock of the first signal generator because of the sampling clock frequency change it may detect the trigger or event signal at a timing different from that of the first signal generator. Then the first signal generator may delay the phase of the timing signal provided to the second signal generator according to the phase delay amount of the divided clock of the second signal generator derived from the clock number.

The objects, advantages and other novel features of the present invention are apparent from the following detailed description when read in conjunction with the appended claims and attached drawings.

DETAILED DESCRIPTION OF THE INVENTION

Figures 1, 2:
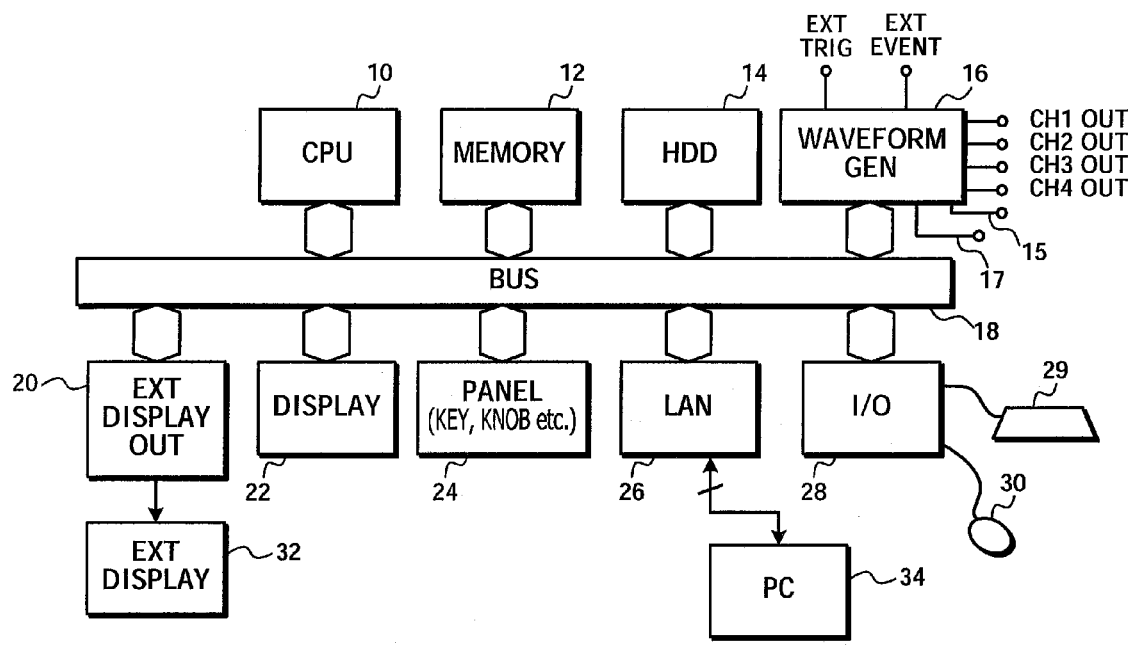
FIG. 1 is a block diagram of one of the signal generators that constitutes a signal generation system according to the present invention.
FIG. 2 is an embodiment of sequence settings using a table.

FIG. 1 is a block diagram of a signal generator representing one of a plurality of signal generators constituting a signal generation system according to the present invention. A central processing unit (CPU) 10 controls the generator according to programs stored on a hard disk drive (HDD) 14, CD ROM drive, or the like. The HDD 14 is also used for storing large amounts of data that may not always be used. A memory 12, such as RAM memory, stores program instructions from the HDD 14 for execution by the CPU 10 and for processing data by the CPU 10. A user may select various settings for the signal generator through an operation panel 24 including key, knob, etc. A display 22 provides visual information on signal patterns and the setting information that the user requires. An external display output circuit 20 provides a video output that may be coupled to an external display 32 to provide a larger display area in addition to the built-in display 22.

A waveform generation circuit 16 generates output signals created or selected by the user. In the present embodiment, the waveform generation circuit 16 has four output channels. The waveform generation circuit 16 may also have inputs for external trigger and external event signals for conditional operation of the waveform generator depending on receipt of these signals. An external clock input/output terminal 15 provides or receives a sampling clock. A link input/output terminal 17 is used for coupling sequence clock (divided clock) and external trigger/event signals with other signal generators via a customized link cable. The link input/output terminal 17 is also used for coupling information evaluated by the CPU 10 with the CPUs of the other signal generators according to the present invention. A single cable may be used to for coupling the sampling clock of the external clock input/output terminal 15 and the sequence clock and the external trigger/event signals of the link input/output terminal 17 with the other signal generators. The input and output modes are alternative according to user settings.

An I/O port 28 may be used for coupling an external keyboard 29, pointing device, such as a mouse 30, and the like to the signal generator. The external keyboard 29 and mouse 30 work with the operation panel 24 as operation means of the signal generator. A LAN (Local Area Network) interface 26 is used for controlling the signal generator with a remote PC and/or data communication. The various blocks of the signal generator are coupled together via a data and control bus 18.

The signal generator provides signal patterns according to user set sequences. FIG. 2 illustrates a table format displayed on the screen where the user may assign index numbers and sequence settings to signal patterns to format desired output signals. In the Example of FIG. 2, the table format shows the index numbers and sequence settings for signal patterns that produce signal outputs for a two channel signal generator. The signal generator outputs the signal pattern(s) according to the index order and stops the output when the signal pattern of the last index completes. The user can assign a sequence control parameter, such as Trigger Wait, Loop, Event Jump To, Go To (unconditional jump), etc., to the respective indexes of the signal pattern sequences to generate more complicated output signals. In the example of FIG. 2, index 3 has a "Wait" sequence control parameter that temporarily suspends the index 3 signal pattern when the signal pattern sequence reaches index 3, and resumes the index 3 signal pattern when a trigger arrives. Index 5 has "Loop" and "Event Jump To" settings where the "Loop" sequence control parameter causes the signal pattern to repeat 100 times when the index of the signal pattern sequence reaches index 5 before proceeding to index 6. If an event signal arrives during the looping signal pattern(s), the "Event Jump To" sequence control parameter causes the index of the signal pattern sequence to jump to index 15. Index 6 has the "Go To" sequence control parameter that causes the index of the signal pattern sequence to jump to index 20 after the index 6 signal pattern completes. The trigger and/or event may come as a trigger signal and/or an event signal from an external circuit. The trigger and/or an event signals may be generated by the signal generator as defined by user through operation of the operation panel 24, keyboard 29, mouse 30 or the like.

Figure 3:
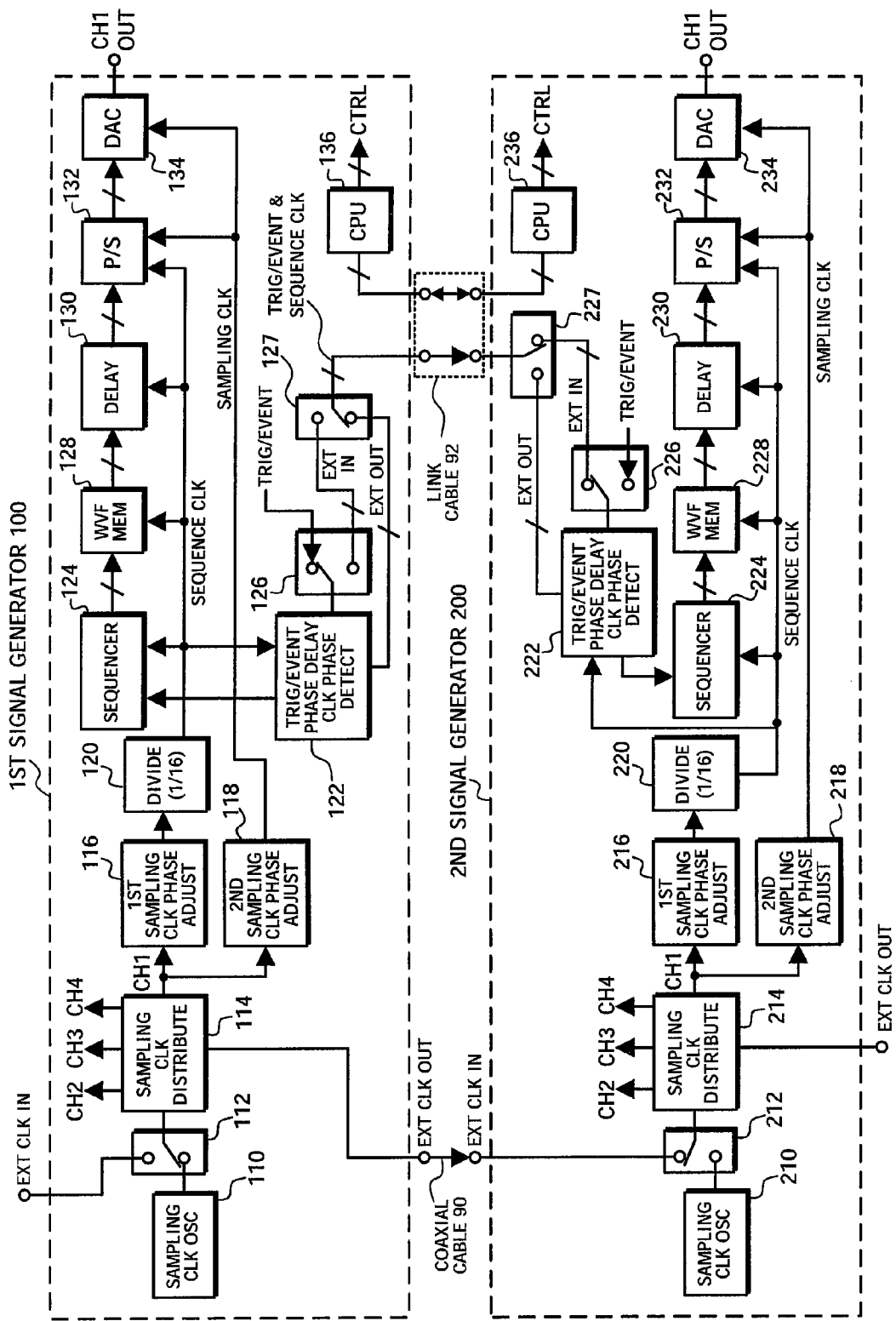
FIG. 3 is a block diagram of an embodiment of a signal generation system having a plurality of signal generators according to the present invention.

FIG. 3 is a block diagram of a signal generation system having two signal generators according the present invention wherein a first signal generator 100 is the master and a second signal generator 200 is the slave. The present invention is not limited to two signal generators and three or more signal generators may constitute the signal generation system. Each signal generator has four channel outputs with FIG. 3 showing the blocks related to only the first channel and does not show the blocks of the other channels since they are similar to those of the first channel. The first and second generators have the same blocks so that the blocks of the first signal generator 100 are mainly described below and those of the second generator 200 are described if necessary.

A sampling clock oscillator 110 provides a sampling clock to a sampling clock distribution circuit 114 via a switch 112. The switch 112 may be switched to provide an external clock input. The sampling clock distribution circuit 114 distributes the sampling clock to the signal generation blocks of the other channels in the first signal generator 100 and provides the sampling clock to an external clock out port that may be coupled to the second generator 200, as shown in FIG. 3.

A first sampling clock phase adjustment circuit 116 adjusts the phase of the sampling clock, if necessary, and provides the sampling clock to a divider 120. A second sampling clock phase adjustment circuit 118 adjusts the phase of the sampling clock, if necessary, and provides the sampling clock to parallel to serial converter 132 and a digital to analog converter (DAC) 134. The digital to analog converter (DAC) 134 converts the sample data of the waveform data corresponding to an output signal into an analog signal according to the sampling clock. A user may change the frequency of the sampling clock oscillator 110, or sampling rate, to change the frequency of the analog output signal due to the fact that the sampling clock frequency must be two or more times higher than that of the analog output signal due to the Nyquist condition. The sampling clock outputs from the first and second sampling clock phase adjustment circuits 116 and 118 are also used for adjusting phase relationship between the four channels in the first signal generator when it is initialized, such as at power-on.

Figure 4:
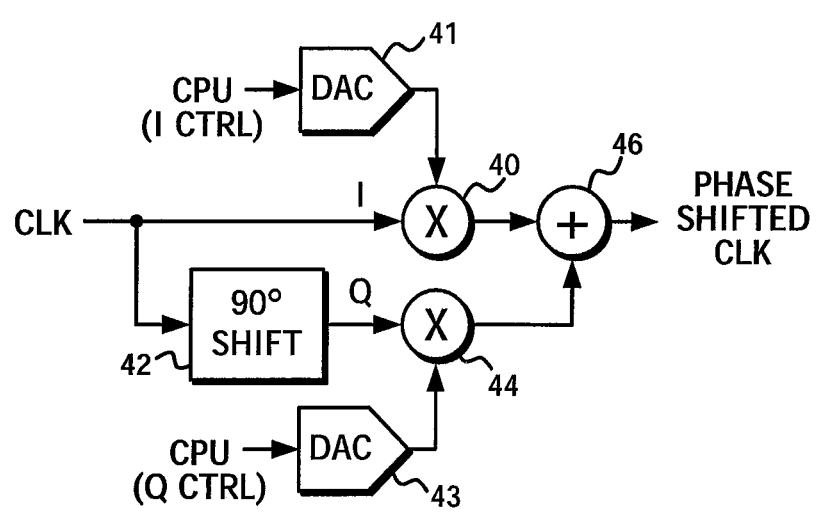
FIG. 4 is a block diagram of an embodiment of a sampling clock phase adjustment circuit.

FIG. 4 is a block diagram of an embodiment of the phase adjustment circuit realized with an IQ modulator. The sampling clock is divided into I and Q components with the Q component being phase shifted by 90° in a 90° shifter 42. Digital I and Q control codes from the CPU 136 are provided to respective digital to analog converters (DACs) 41 and 43. The DACs 41 and 43 convert the digital I and Q control codes to respective analog I and Q control signals which are coupled to respective multipliers 40 and 44. Multiplier 40 also receives the I sampling clock component while multiplier 44 receives the Q sampling clock component. The I control signal and the I sampling clock component are multiplied together and provided to an adder 46 while the Q control signal and the Q sampling clock component are multiplied together and provided to the adder 46. The multiplied I and Q signals are summed by the adder 46 to provides a desired delay to the clock phase under control of the CPU 136.

Returning to FIG. 3, the divider 120 divides the sampling clock and provides the divided clock as a sequence clock to sequencer 124, waveform memory 128, delay circuit 130 and a parallel to serial converter 132 functioning as a data generator. In this embodiment, the dividing ratio is 16. A trigger/event phase delay and clock phase detection circuit 122 delays the phase of a received trigger signal or event signal, if necessary, and provide trigger or event signal to the sequencer 124 and the second signal generator 200. The circuit 122 also can detect the phase of the sequence clock though the signal generator 100, or the master side. The corresponding circuit 222 in the second signal generator 200, or the slave side, uses sequence clock phase detection feature to compare the phase of the sequence clock of the first signal generator 100 and the phase of the sequence clock of the second signal generator 200 to adjust the phase of the second signal generator sequence clock by controlling the first sampling clock phase adjustment circuit 216 in the second signal generator 200 at an initial setting, such as power-on, etc. The sequencer 124 provides addresses to the waveform memory 128 for providing the waveform data wherein the waveform data output is controlled as described with FIG. 2.

A switch 126 selectively provides the trigger/event signals and the sequence clock from another signal generator or the external/internal trigger/event signals to the circuit 122. Switch 127 is an input/output toggle switch that can provide the trigger/event signals and the sequence clock to another signal generator or alternatively receive those signals from the other signal generator. The embodiment of FIG. 3 shows the setting that the first signal generator 100 provides the trigger/event signals and sequence clock to the second signal generator.

A coaxial cable 90 provides the sampling clock from the first signal generator 100 to the second signal generator 200. A link cable 92 provides the trigger/event signals and sequence clock from the first signal generator 100 to the second signal generator 200. The link cable 92 is also used for exchanging information between the CPUs 136 and 236 of the signal generators 100 and 200, such as the information of the number of sampling clocks equivalent to the delay between the signal generators 100 and 200 when the sampling frequency is changed as described below. The link cable 92 is the cable specifically dedicated for the signal generators 100 and 200 with the amount of signal delay in the link cable 92 being known. It is conventional that the coaxial cable 90 provides the sampling clock as the conventional signal generators use such a cable. FIG. 3 shows the coaxial cable 90 and the link cable 92 separately but the cables 90 and 92 they may be provided as one cable.

Figure 5:
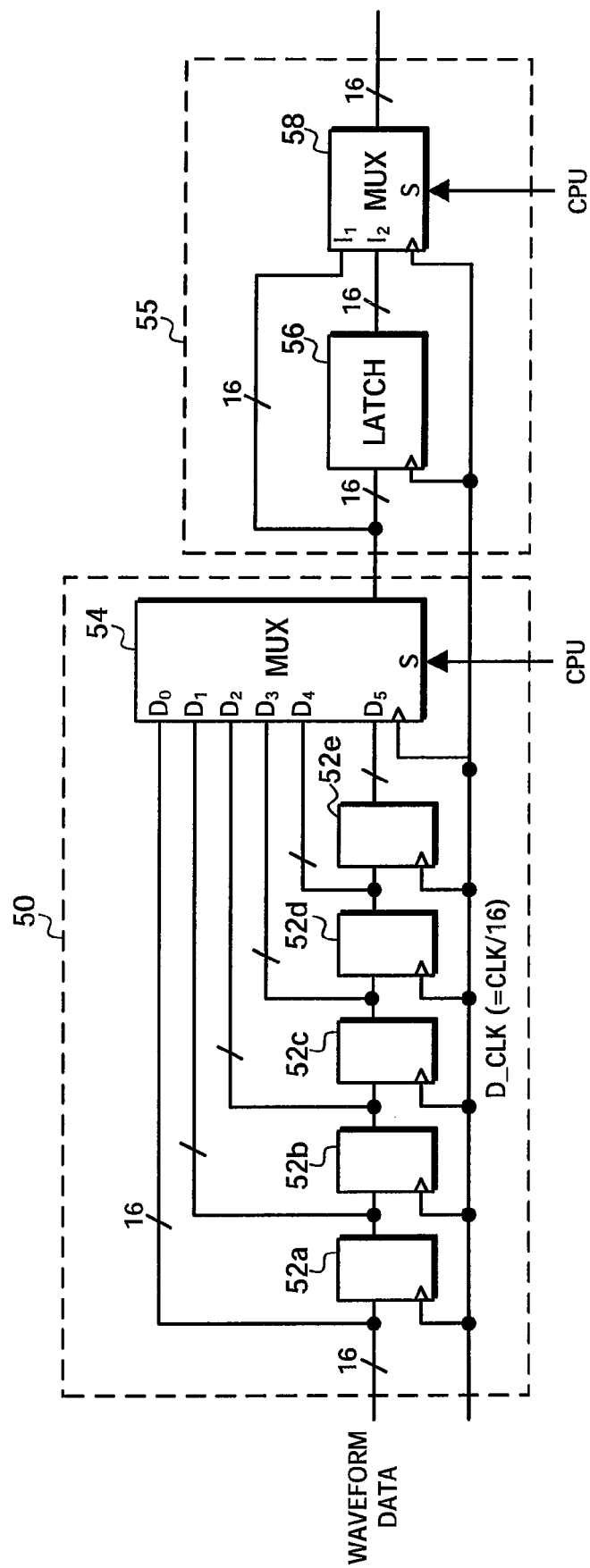
FIG. 5 is a block diagram of an embodiment of a delay circuit.

FIG. 5 is a block diagram of an embodiment of the delay circuit 130 that can delay the waveform data by one sampling clock. The delay circuit 130 has first and second delay blocks 50 and 55. The first delay block 50 receives the parallel waveform data from the waveform memory 128 and delays the parallel waveform data by one sequence clock (divided clock). The second delay block delays parallel waveform data by one sampling clock. In the first delay block 50, the parallel waveform data is provided to a parallel input $D_0$ of a multiplexer 54 and to a shift register 52a. The parallel waveform data is sequentially coupled from shift register 52a to four additional shift registers 52b-52e. The shift registers 52a-52e respectively delay the parallel waveform data by one sequence clock D_CLK with the output of each shift register being coupled to respective parallel inputs $D_1$-$D5$ of the multiplexer 54. The multiplexer 54 under CPU 136 control selects one of parallel waveform data sets at the inputs D0-D5 having no delay to a maximum delay of five sequence clocks to adjust the delay amount.

Figure 6:
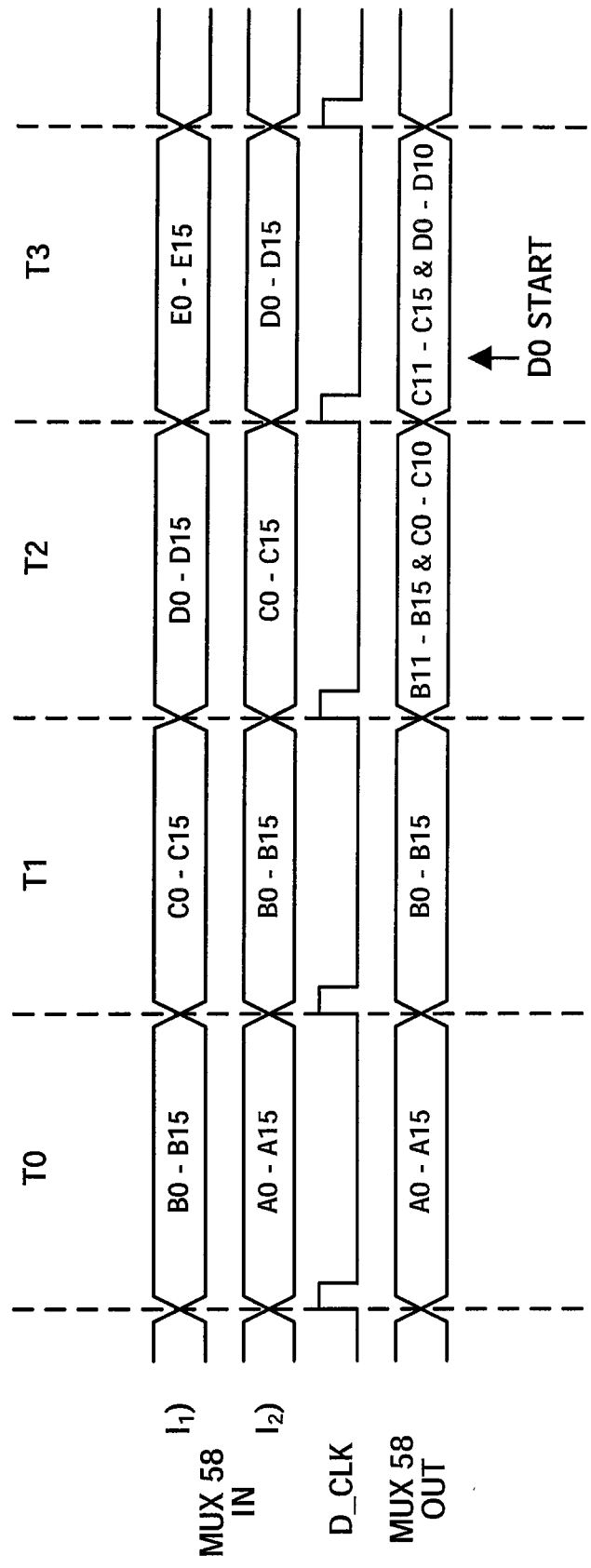
FIG. 6 is a timing chart of data delay with data rearrangement of a second delay block 55.

In the second delay block 55, a multiplexer 58 receives the waveform data directly from the multiplexer 54 at a terminal $I_1$ and the waveform data of one divided clock delay at a terminal $I_2$ via a latch 56, and provides reordered waveform data under the control of the CPU 136. FIG. 6 shows the case of delaying five sampling clocks that extracts five bits of the waveform data provided at the terminal $I_2$ and eleven bits of the waveform data provided at the terminal $I_1$ to produce a sixteen bit parallel waveform data where the bit data order is rearranged.

FIG. 6 is a timing charts showing the relationship between the input data and the output data of the multiplexer 58 wherein sets of parallel data are sequentially provided as A0-A15, B0-B15, C0-C15 . . . in alphabetical order from the multiplexer 54 for convenience of explanation. Periods T0-T3 are periods of the sequence clock (divided clock) respectively and each of them is equivalent to sixteen periods of the sampling clock (not shown for simplicity).

The multiplexer 58 produces 16 bit rearranged parallel data by selecting 16 bits from 32 bits from the first and second input $I_1$ and $I_2$, and rearranging them according to the value provided by the CPU 136 (five sampling clocks). The parallel to serial converter 132 converts the rearranged parallel data from the multiplexer 58 to serial data according to the sampling clock. The signal generator 100 is generally provided with a plurality of data generators consisting of the sequencer 124, waveform memory 128, delay circuit 130 and parallel to serial converter 132 to generate multiple serial data outputs. The multiple serial data outputs may be treated as parallel data and converted to an analog signal by a digital to analog converter (DAC). FIG. 3 shows the input line to the DAC 134 as a parallel line indicating the serial data outputs from multiple parallel to serial converters. This enables the generation of a high frequency analog signal since the bit rates of the multiple serial data outputs are increased over the stored parallel data in the waveform memory 128. Alternately, the serial data of the data generator may be provided to a circuit under test as is. Japanese patent publication No. 2007-295132 corresponding to U.S. Pat. No. 7,436,725 discloses the above scheme in detail.

Figure 7:
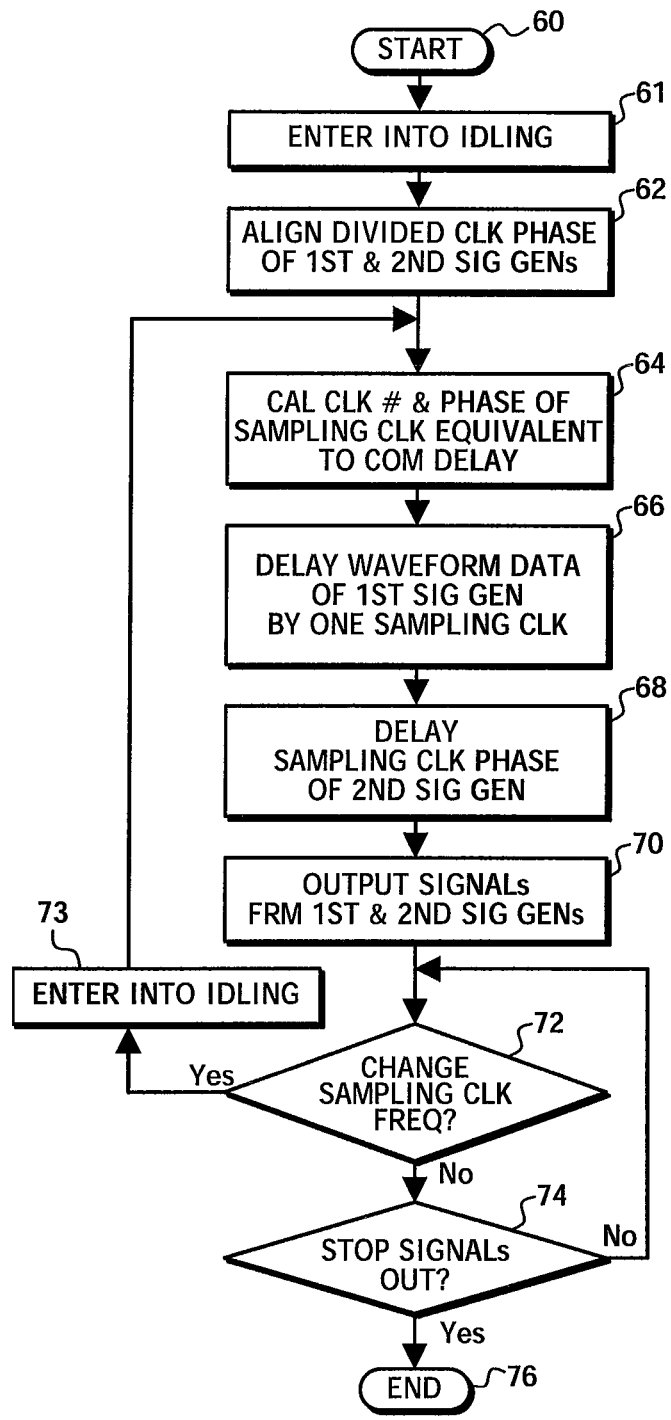
FIG. 7 is a flowchart of phase adjustment between signal generators according to the present invention.

FIG. 7 is a flowchart of the phase adjustment between the signal generators according to the present invention. Though the delay amount between the generators including the link cable 92 and the peripheral circuits is known and constant, the key point is that the change of the sampling clock frequency changes the number of clock cycles of the sampling clock that are equivalent to the delay amount. Therefore, if the phases between the signal generators are not adjusted at the sampling clock frequency change, the output phases of the respective generators are going to be out of alignment after the sampling clock frequency change. In the present invention, when the sampling frequency is changed (step 72), the CPU of the first or second signal generator calculates the number of clock cycles of the sampling clock equivalent to the communication delay between the generators (step 64) and the phase relationship between the generators is adjusted using the calculated value. The calculation is conducted by one of the first and second signal generators but both the CPUs share the information of the calculated value via the link cable. Therefore, the generators may not be necessary to detect the phase of the output signal each time of the sampling frequency change for the phase adjustment.

As described, the phase adjustment is usually conducted based on the calculated value of the number of clock cycles but the generators may conduct the phase adjustment by the circuit 222 actually detecting the clock phase at a proper occasion such as the power-on (step 62). This compensates for an accumulative error that is derived from the phase adjustments based on only the calculated values. The phase adjustment of the sampling clock is conducted by the first sampling clock phase adjustment circuit 216 in the second signal generator under the control of the CPU 236 as described above.

It may be better that the generators are in the idling status (step 73) from the operation start before substantial signal outputs at a step 70. After the power-on (step 61), the sequencers may provide addresses to the waveform memories for reading the waveform data corresponding to zero voltage. If the operation has started and then the sampling frequency is changed (step 72) the sequencers may provide addresses to the waveform memories for reading the waveform data corresponding to the last output voltage, such as 0.8V etc., to keep the voltage. However, if some distortion of the output waveform at the sampling frequency change is acceptable it may not be necessary to enter the idling status after the sampling frequency change at the step 72.

At a step 66, the CPU 136 controls the delay circuit 130 in the first signal generator to delay the waveform data according to the number of clock cycles of the sampling clock equivalent to the communication delay calculated at the step 64. As described above, the delay amount is adjustable by one sampling clock with the rearranging the data order of the parallel waveform data. In the delay circuit 130, the first delay block 50 delays the amount by the sampling clock number equivalent to the communication delay divisible by 16 sampling clocks and the second delay block 55 delays the residual amount divisible by one sampling clock. In a step 68, the first and second sequence clock phase adjustment circuits 216 and 218 in the second signal generator adjust the phase of the waveform data in the second signal generator that is less than one cycle of the sampling clock. Alternatively, the first and second sequence clock phase adjustment circuits 116 and 118 in the first signal generator may adjust the phase of the waveform data in the first signal generator that is less than one cycle of the sampling clock.

When the phase adjustment has finished for the first and second generators 100 and 200, the signal generators 100 and 200 exit the idling status (Step 73) and starts or resumes providing the substantial output signals (step 70). The signal output stops by the end of preset sequence or user operation (step 74).

Another problem with the sampling frequency change is described below. The second signal generator 200 conducts the trigger/event function when the circuit 222 detects the trigger and/or event signals from the first signal generator 100 according to the sequence clock (divided clock). Though the phase of the sequence clock of the second signal generator 200 is aligned with that of the first signal generator at a time of initialization, such as the power-on, every sampling frequency change causes the phase of the second signal generator 200 sequence clock to differ from the phase of the first signal generator 100 so that detection timing of the trigger and/or event signals differs between the first and second signal generators. The phase delay of the sequence clock of the second signal generator relative to that of the first signal generator is then calculated based on the sampling clock number equivalent to the communication delay calculated every sampling frequency change. The circuit 122 adjusts the phase of the trigger and event signals (timing signals) provided from the first signal generator to the second signal generator based on the calculated phase delay of the sequence clock of the second signal generator. Note that if the phase of the sequence delays one cycle the phase delay returns to zero.

Figure 8:
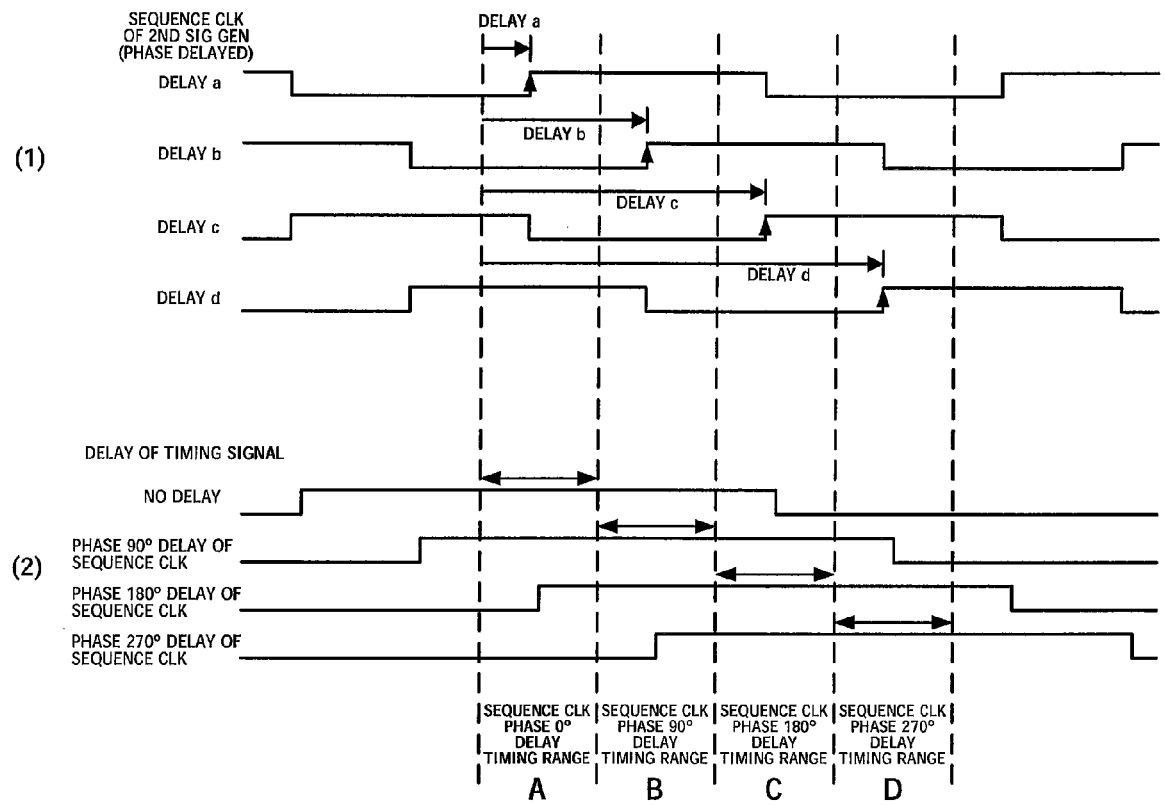
FIG. 8 is a timing chart showing delay relationship between phase delay of sequence clock and delay of a timing signal in the second signal generator.

FIG. 8 is a timing chart showing relationship between phase delay of the sequence clock of the second signal generator and delay of the timing signal. FIG. 8 (1) shows the delay of the sequence clock of the second signal generator and FIG. 8 (2) shows the delay of the timing signal. If the delay of the sequence clock is from 0 to 90 degrees (Range A), the circuit 122 of the first signal generator provides the timing signals without delay. If the delay of the sequence clock is from 90 to 180 degrees (Range B), the circuit 122 provides the timing signals with 90 degree delay. If the delay of the sequence clock is from 180 to 270 degrees (Range C), the circuit 122 provides the timing signals with 180 degree delay. If the delay of the sequence clock is from 270 to 360 degrees (Range D), the circuit 122 provides the timing signals with 270 degree delay. If a complicated circuit is acceptable, the circuit 122 of the first signal generator may provide the same delay as the phase delay of the sequence clock of the second signal generator. For simpler circuit, if the delay of the sequence clock is from 0 to 180 degrees (Ranges A and B), the circuit 122 may provide the timing signals without delay and if the delay of the sequence clock is from 180 to 360 degrees (Ranges C and D), the circuit 122 may provide the timing signals with 180 degree delay though the time margin for detecting the timing signal becomes smaller.

Although the invention has been disclosed in terms of the preferred and alternative embodiments disclosed herein, those skilled in the art will appreciate that modifications and improvements may be made without departing from the scope of the invention.

What is claimed is:
1. A signal generation system comprising:
   first and second signal generators, each having means for providing a frequency variable sampling clock, means for dividing the frequency variable sampling clock to provide a divided clock, means for sequentially controlling a waveform data supply order, means for providing waveform data according to the divided clock, timing control means for detecting a phase of the divided clock and providing a timing signal that controls the waveform data supply order, means for delaying the waveform data by one frequency variable sampling clock, means for parallel to serial converting the waveform data from the means for delaying and providing fast waveform data according to the frequency variable sampling clock and central control means for controlling the respective first and second signal generators; and communication means for providing the frequency variable sampling clock and the timing signal of the first signal generator to the second signal generator and for communicating information between the central control means of the first and second signal generators wherein when the frequency of the frequency variable sampling clock of the first signal generator is changed, the number of clock cycles of the frequency changed frequency variable sampling clock representative of a delay amount of the communication means is calculated and the means for delaying of the first signal generator delays the waveform data, thereby adjusting a phase relationship between the fast waveform data generated in the first and second signal generators.

2. The signal generation system as recited in claim 1 wherein each of the first and second signal generators further comprise first means for adjusting the phase of the frequency variable sampling clock used by the means for dividing and second means for adjusting the phase of the frequency variable sampling clock used by the means for parallel to serial converting respectively and when the frequency of the frequency variable sampling clock of the first signal generator is changed, the central control means of the first or second signal generator calculates the number of clock cycles of the frequency changed frequency variable sampling clock and a sampling clock phase representative of the delay amount of the communication means, and the means for delaying of the first signal generator delays the waveform data based on the number of clock cycles, and the first and second means for adjusting of the first or second signal generator adjust the sampling clock based on the calculated sampling clock phase thereby adjusting the phase relationship between the fast waveform data generated in the first and second signal generators.

3. The signal generation system as recited in claim 1 wherein the communication means provides the divided clock of the first signal generator to the second signal generator, and to the timing control means of the second signal generator for comparing the phases of the divided clocks of the first and second signal generators with the central control means providing control of a means for adjusting the phase of the frequency variable sampling clock used by the means for dividing of the second signal generator to align the phases of the divided clocks of the first and second signal generators in response to the comparison of the phases of the divided clocks of the first and second signal generators prior to the central control means of the first or second signal generator calculating the number of clock cycles of the frequency changed frequency variable sampling clock representative of the delay amount of the communication means.

4. The signal generation system as recited in claim 1 wherein the timing control means of the first signal generator delays a phase of trigger and event signals provided to the second signal generator with a phase delay of the divided clock of the second signal generator relative to a phase delay of the first signal generator.

5. The signal generation system as recited in claim 1 wherein the central control means for controlling the respective first and second signal generators are CPUs.

6. The signal generation system as recited in claim 1 wherein the timing signal is a trigger signal or an event signal.

7. The signal generation system as recited in claim 1 wherein the fast waveform data is converted to an analog signal according to the divided clock.

8. The signal generation system as recited in claim 1 wherein the first and second signal generators are in idle status during the phase adjustment.

* * * * *